United States Patent [19]

Calviello

[11] Patent Number: 4,549,194
[45] Date of Patent: Oct. 22, 1985

[54] LIGHT SENSITIVE DETECTOR

[75] Inventor: Joseph A. Calviello, Kings Park, N.Y.

[73] Assignee: Eaton Corporation, Cleveland, Ohio

[21] Appl. No.: 365,352

[22] Filed: Mar. 29, 1982

[51] Int. Cl.[4] .......................................... H01L 31/00
[52] U.S. Cl. .................................... 357/30; 357/4; 357/6; 357/68; 357/70
[58] Field of Search ................... 357/30, 12, 55, 6, 69, 357/4, 68, 70, 65, 15

[56] References Cited

U.S. PATENT DOCUMENTS

| 4,065,780 | 12/1977 | Ballantyne | 357/6 |
| 4,353,070 | 10/1982 | Pyee | 357/9 |
| 4,411,719 | 10/1983 | Lindberg | 357/69 |

Primary Examiner—James W. Davie
Assistant Examiner—Georgia Y. Epps
Attorney, Agent, or Firm—C. H. Grace; V. J. Ranucci

[57] ABSTRACT

A tunnel diode having a generally rectangular junction area in the $10^{-10}$ to $10^{-11}$ cm$^2$ range formed in a quasi-planar structure of a first metal, an oxide of the first metal and a second metal. The first metal may be tantalum or other similarly slow oxidizable metals. The second metal may be selected from a group also including tantalum. For a symmetrical junction, the first and second metals are the same, however, for an asymmetrical junction the first and second metals are different. To reduce the diode series electrical and thermal resistance, a gold layer is deposited over the first and second metals. The gold layer over the first metal is deposited everywhere except at or within a few microns of the junction. The device provides a small junction area and also negligible parasitic shunt capacitance which are necessary for efficient room temperature operation at frequencies in the submillimeter to optical region. Direct and heterodyne detection in the 10 microns region has been successfully achieved with these devices.

5 Claims, 12 Drawing Figures

LIGHT SENSITIVE DETECTOR

1. Field

This invention relates to improvement in metal-oxide-metal tunnel diodes (MOMTDs), and in particular, to the design of tunnel junctions in a quasi-planar configuration designed for room temperature operation at submillimeter and optical wave frequencies.

2. Prior Art

Characteristics required for high quality MOMTDs operating in the submillimeter and optical frequency region include minimal parasitic shunt capacitance, series resistance, skin effect, thermal resistance and junction area. In addition, the diode must provide stable characteristics and the structural configuration should be suitable for use in monolithic integrated circuits and arrays.

High quality GaAs Schottky barrier diodes have been successfully used as efficient room temperature detectors and mixers up to 300 GHz. It appears that their operation can be extended to about 500 GHz. However, these diodes will not operate as efficient detectors or mixers much beyond 500 GHz due to carrier lifetime, carrier inertia and dielectric relaxation phenomena.

Figure 1:
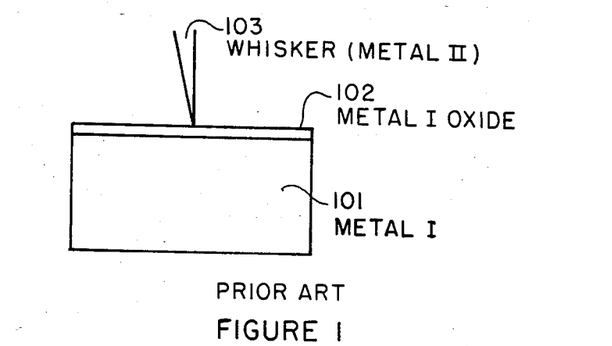
FIG. 1 is a cross sectional view of a prior art point contact tunnel diode.

Whisker-type MOMTD structures have been successfully used as detectors and mixers at frequencies ranging from submillimeter to infrared wavelengths with reasonably good performance. FIG. 1 shows a whisker device comprising a first metal (metal I) substrate a metal I oxide 102 on the surface of metal I and a whisker 103 made of a second metal (metal II) in contact with the oxide 102. The major disadvantages of the whisker-type structure is the extreme instability of the junction due to thermal and pressure effects. These disadvantages render the whisker-type structure a laboratory curiosity, but even if these could be overcome, the whisker-type structures would not find extensive use because of its incompatibility with more advanced system designs such as integrated circuits and integrated circuit arrays.

Figure 2:
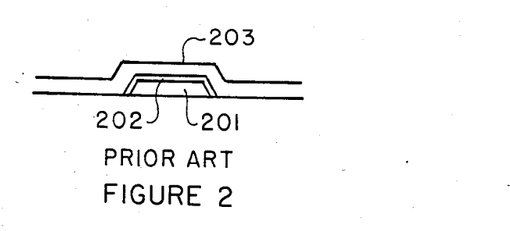
FIG. 2 is a cross sectional view of a prior art planar tunnel diode.
Figure 3:
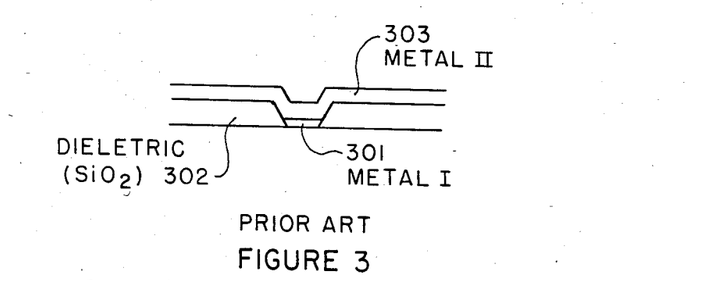
FIG. 3 is a cross sectional view of a prior art planar tunnel diode having a circular junction configuration.
Figure 4:
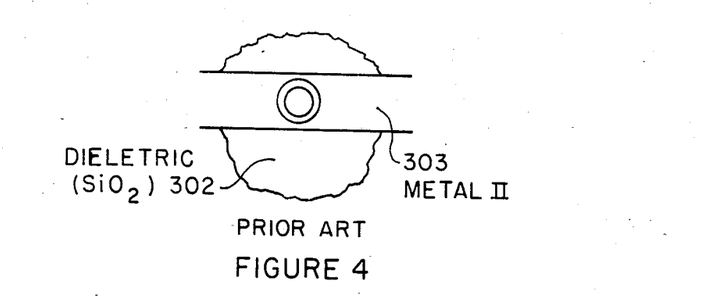
FIG. 4 is a plan view of the device shown in FIG. 3.

To overcome the defects inherent in point contact devices, attempts have been made to fabricate MOMTD devices in various planar structures such as those shown in FIGS. 2, 3 and 4. FIG. 2 is a side cross sectional view of a device comprising a first metal 201, a metal oxide 202, and a second metal 203 positioned essentially in planar layers one above the other. FIG. 3 is a side cross sectional view of a device comprising a first metal 301, a dielectric 302 and a second metal 303. FIG 4 is a plan view of the device shown in FIG. 3 illustrating the circular configuration of the junction. This latter device is an obvious attempt to produce the equivalent of a point contact device through planar technology; however, the small dimensions of the point contact junction cannot be achieved in this simple way. In addition, these designs exhibit a number of defects including high series resistance due to thin metals I and II layers high parasitic shunt capacitance, large junction areas in the order of $10^{-7}$ cm$^2$ to $10^{-8}$ cm$^2$, and an undesirably high skin resistance. All of these defects severely limit the operating efficiency of these devices at frequencies in the order of 1000 GHz.

There are additional prior art processing related problems which prevent achieving a satisfactory planar device. The currently used planar technology prevents defining an extremely small junction area, producing a metal I layer with a high quality uniform thickness free of impurities and pinholes or a metal I surface that is extremely smooth and without defects.

Prior art processing techniques generally use either wet chemical etches or pure sputtering etch. Both of these techniques lead to the formation of poor surface morphology which is not conducive to obtaining a thin uniform oxide necessary for the fabrication of high performance devices. Using conventional optical lithography combined with either of the above etching processes prevents defining the required small junction area of $10^{-10}$ cm$^2$ to $10^{-11}$ cm$^2$.

Even if it were possible to define a line width of 1 $\mu$m it would still be difficult to fabricate the desired junction area reliably using the above prior art processing techniques. In order to realize a 1 $\mu$m line width, the thickness of the metal would have to be limited to about 1000 Å, thus increasing the resistivity of the leads to an unacceptably high values.

The ability of produce a very small junction area in a planar diode structure, such as that shown in FIGS. 3 and 4, is restricted by the dielectric layers. In the structure shown in FIGS. 3 and 4, the SiO$_2$ or similar dielectric layers must be very thin in order to photolithographically define the junction. If the dielectric layer is too thick, the junction could easily be ill-defined because the etching may not proceed uniformly through the thick dielectric layer. Since the dielectric layer has to be thin (in the order of 2000 Å), the region where metals I and II overlap will contribute an excessive amount of parasitic shunt capacitance. This capacitance will increase the diode's RC time constant, and thus lower the useful operating range of the diode to frequencies well below 1000 GHz. The operation of devices fabricated in this way therefore will become comparable to that of GaAs Schottky diodes, making such MOMTD useless for the desired frequency range.

SUMMARY

In the present invention, the required characteristics for a MOMTD at submicron frequencies, which include negligible parasitic shunt capacitance of $10^{-5}$ pf or less, a submicron junction area and very low series resistance are achieved by means of a novel structural configuration which permits the definition of submicron line widths. The structure utilizes planar technology, however, an extremely small peripheral junction is formed, rather than the usual large planar junction. In addition, the leads are formed in a semi-arch configuration to function as monopole antenna elements, enhancing the efficiency of the device. Lead resistance normally incurred in the metal II layer is reduced by providing a relatively thick overlayer of gold which may range from 1000 Å to 5000 Å.

In the processing technique, reactive plasma etching is used to define the line widths and also to etch the surface of the junction prior to the formation of the oxide layer. A peninsula-like projection used to form the submicron peripheral junction is defined by reactive plasma etching, resulting in a clean, smooth peripheral surface edge, an essential preparatory step in achieving a uniformly thin and pinhole-free first metal oxide layer at the junction. The formation of such a high quality oxide at the junction is important in the tunneling process and is therefore important in producing a reliable and high performance MOMTD.

DETAILED DESCRIPTION

Sommerfeld and Bethe were the first to make a theoretical study of the tunneling effect. They showed that if two metal electrodes are separated by a very thin insulating film, current can flow between the two metal electrodes via tunneling. Simmons extended Sommerfeld's theory to include image forces and derived a generalized formula for the electric tunnel effect between electrodes (symmetrical junction) and between dissimilar electrodes (asymmetrical junction).

A rigorous analysis of the MOMTD requires an exact solution of Schroedinger's wave equation in one dimension for a variable potential field. Therefore to simplify the analysis all theories are based on the following assumptions: (a) WKB (Wentzel), Krammers-Brillouin) approximation is valid, (b) metal electrodes can be treated as "free electrons in a box" thus ignoring their detailed energy band structure, and (c) a parabolic energy band exists in the insulator.

Simmons calculated the current-voltage (I-V) characteristic of an MOM junction using a one-band model and the effective mass approximation. This approximation becomes somewhat inaccurate whenever carriers at energy levels near the center of the insulator bandgap contribute to the junction current. In the one-band model, the energy band structure of the insulator is represented by a conduction band and a valence band separated by an infinite band gap (hence one-band model). As long as the band gap in the insulator is much greater than the surface barrier voltage, the use of one-band model is sufficient. For an insulator such as $Ta_2O_5$ with a band gap near 4 to 4.5 eV, the use of a two-band model wil give better results when the barrier voltages are about 2 eV, or greater. In addition, the two-band model renders more accurate analysis and predicts the I-V characteristics of asymmetrical junctions as well as their behavior as a function of temperature. The presence of the valence band, in the two-band model, affects the tunneling process in two ways: (1) it affords a parallel path for the current to flow via hole conduction, and (2) it results in reduced wave attenuation in the potential barriers.

Figure 5:
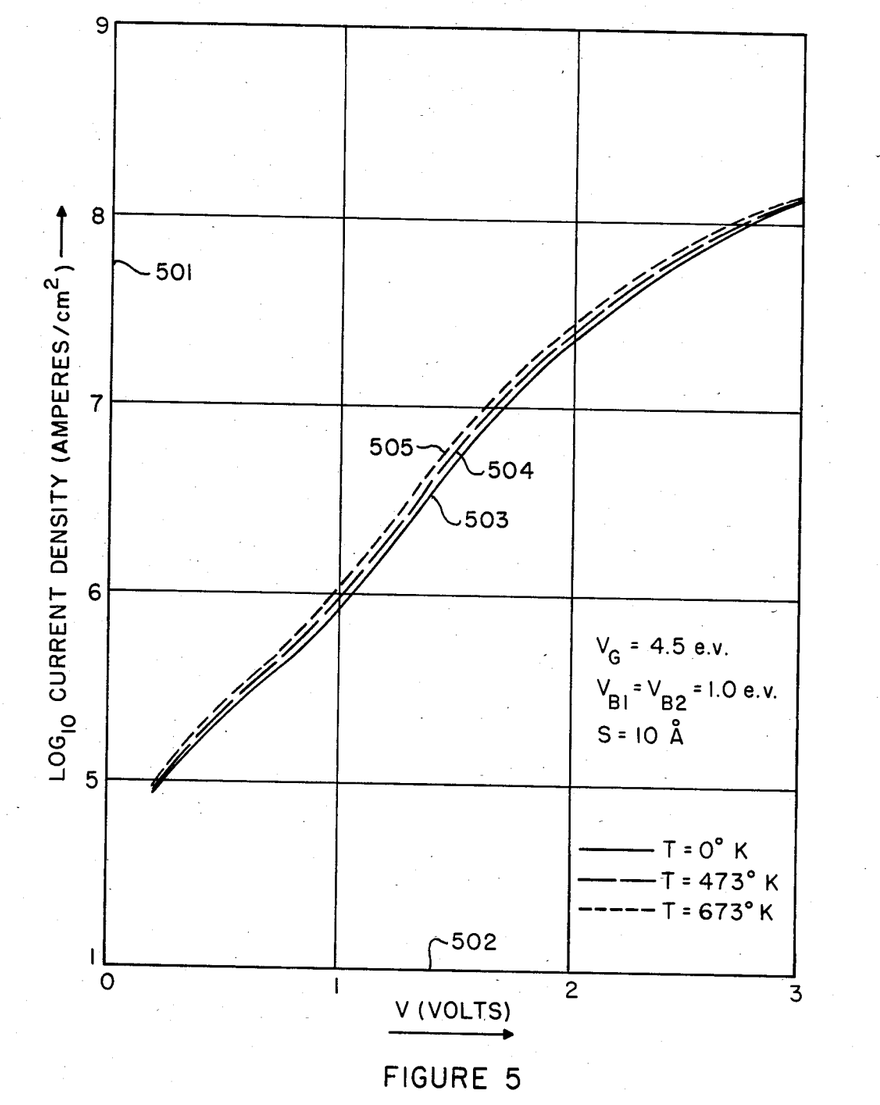
FIG. 5 is the calculated current-voltage characteristic of a symmetrical diode in which the oxide thickness is 10 Å.
Figure 6:
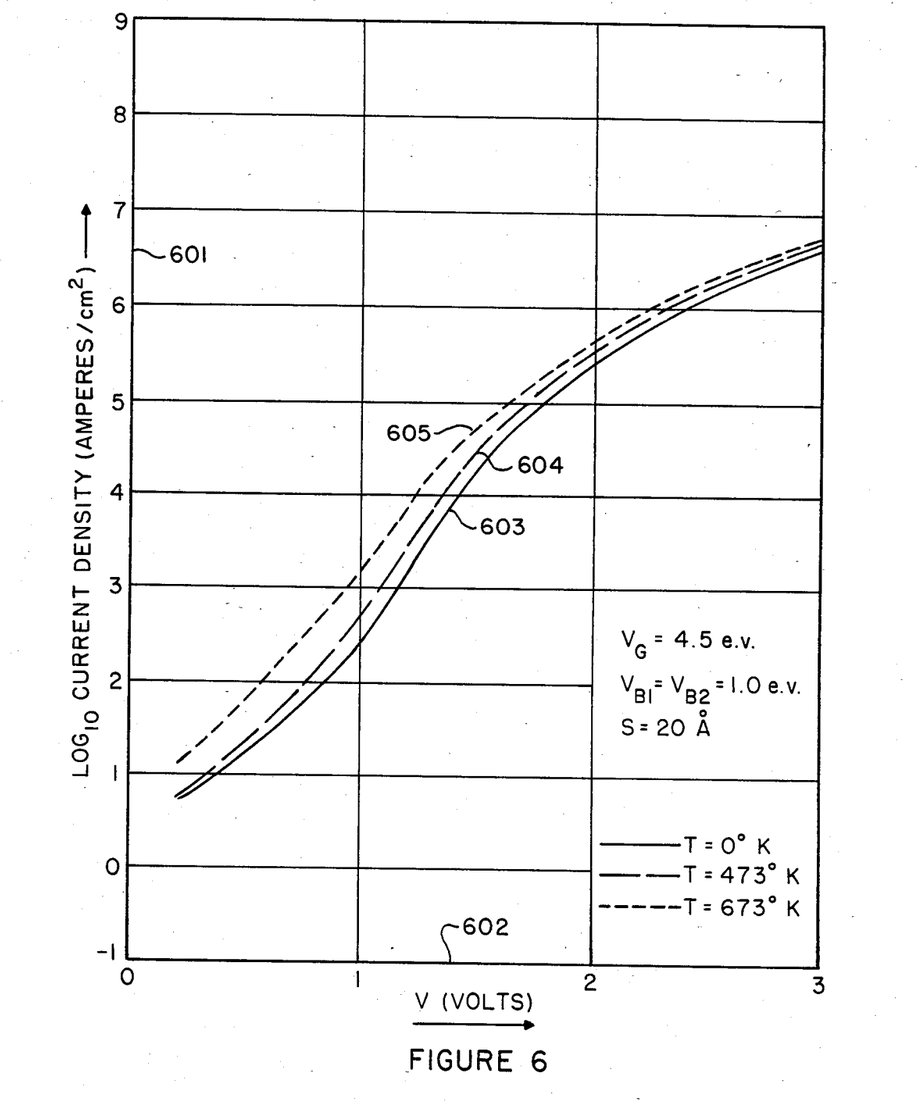
FIG. 6 is the calculated current-voltage characteristic of a symmetrical diode in which the oxide thickness is 20 Å.
Figure 7:
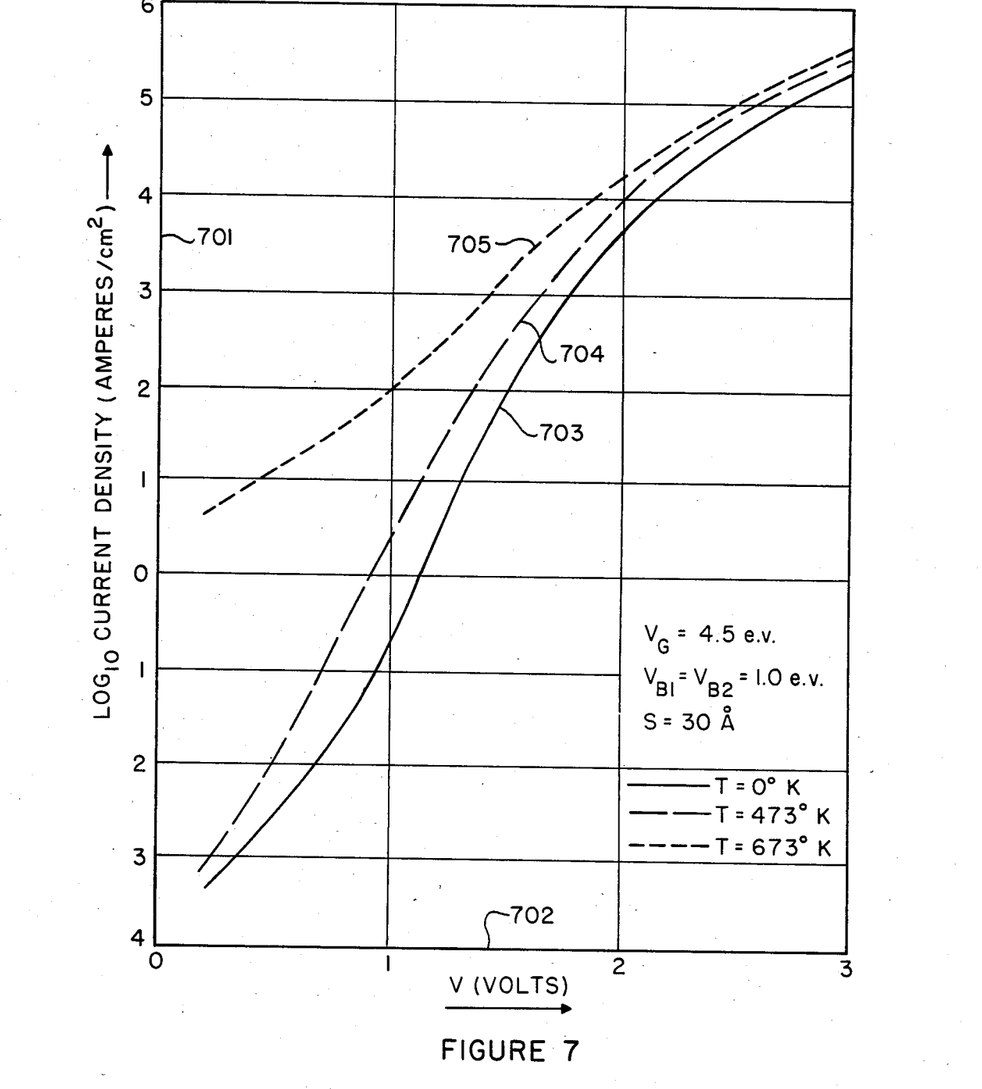
FIG. 7 is the calculated current-voltage characteristic of a symmetrical diode in which the oxide thickness is 30 Å.

Using the two-band model, the I-V characteristics were calculated for a symmetrical $Ta-Ta_2O_5-Ta$ MOMTD as a function of temperature and the results are plotted in FIGS. 5, 6, and 7. In FIG. 5, the ordinate 501 represents current density in amperes per square centimeter, while the abscissa 502 represents voltage in volts. A first graph 503, plotted in a solid line represents the I-V characteristic at a temperature of 673° K., a second plotted in a long dash, represents the characteristic at 473° K., and a third graph 505 plotted in a short dash, represents the characteristic at 0° K.

FIGS. 6 and 7 use drawing numerals with the same last two digits to designate similar information. Only the first digit is changed to correspond to the Figure number. These figures clearly show that tunneling theory predicts that the I-V characteristics are temperature dependent, and that the dependence on temperature decreases as the oxide thickness decreases to about 10 Å or thinner. Therefore for an MOMTD with an oxide thickness in the 5 to 10 Å range the I-V characteristic should be almost temperature independent. Using the above theory, the I-V characteristic of an asymmetrical $Ta-Ta_2O_5$ metal II MOMTD as a function of oxide thickness was also calculated for two values of metal I barrier potential: $\phi_1 = 0.5$, 1.0 eV and for $\Delta\phi = 1$ eV, where $\Delta\phi = (\phi_2 - \phi_1)$ and $\phi_1$ and $\phi_2$ are the barrier potentials at the metal I and metal II oxide interfaces, respectively. The result is shown in FIGS. 8 and 9.

Figure 8:
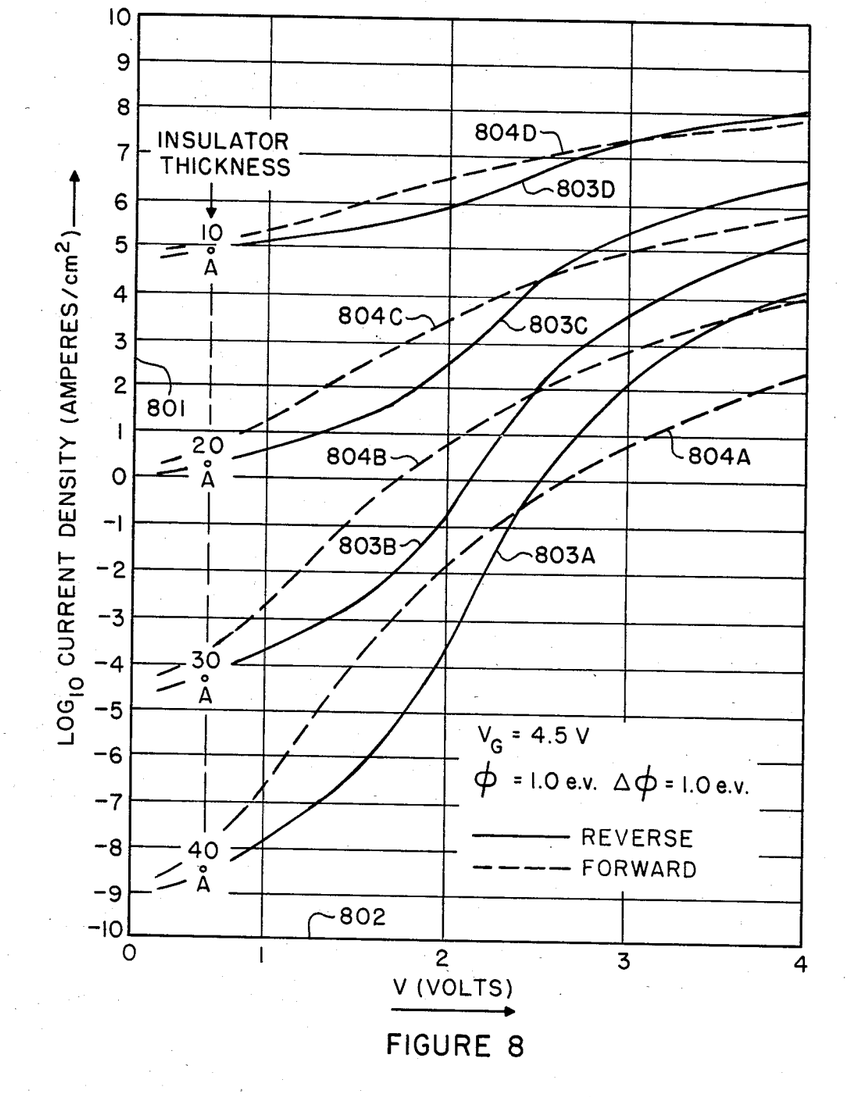
FIG. 8 is the calculated current-voltage characteristic of an asymmetrical diode where the barrier potential is 1.0 electron volt.
Figure 9:
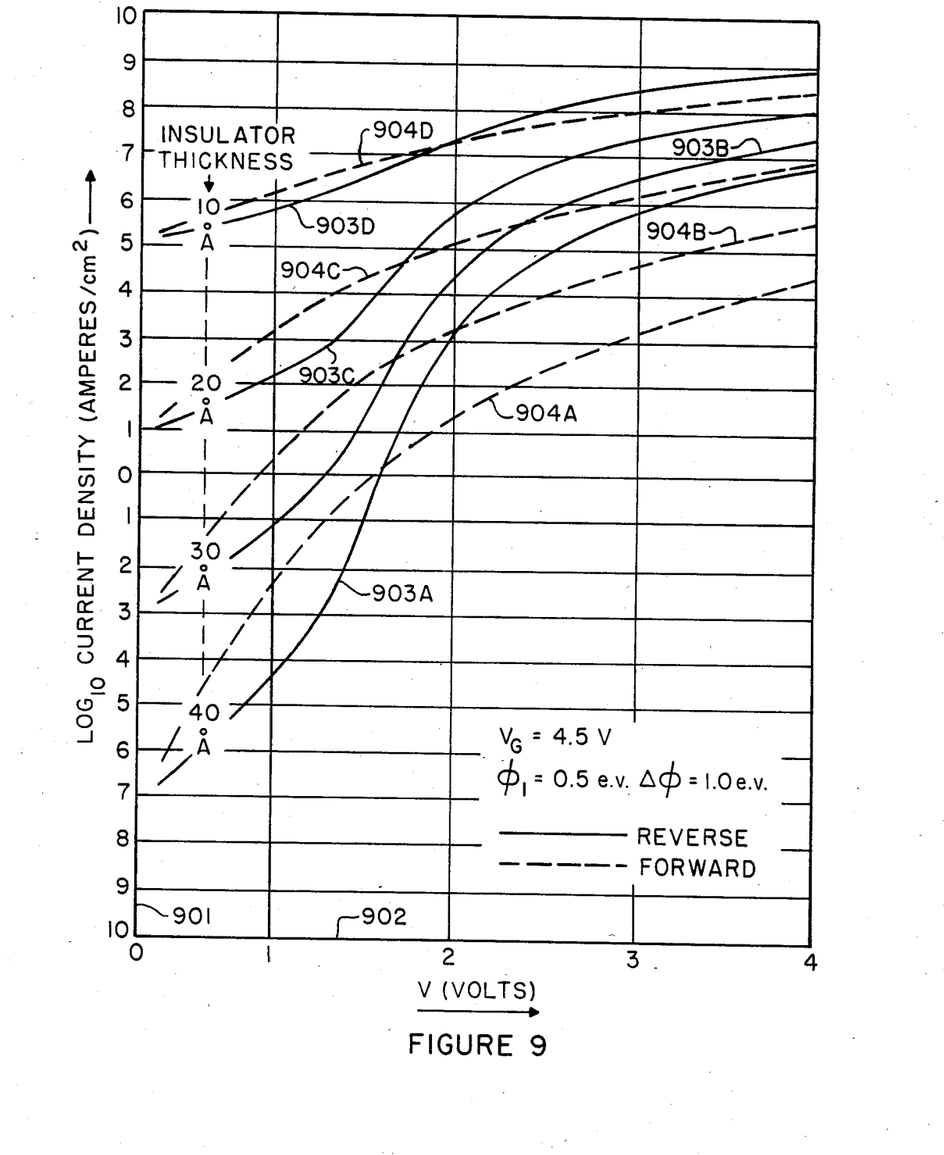
FIG. 9 is the calculated current-voltage characteristic of an asymmetrical diode in which the barrier potential is 0.5 electron volt.

In FIG. 8, the ordinate represents the current density in amperes per square centimeter, while the abscissa represents the junction voltage in volts. A family of solid graphs representing the characteristic at a reverse voltage for various insulation thicknesses are designed by drawing numeral 803 while a family of graphs representing forward voltage are designated by drawing numeral 804. The insulation thicknesses ranges from 40 Å down to 10 Å in 10 Å steps indicated by adding a suffix of A, B, C, and D respectively to the drawing numeral. The same drawing number system is used for FIG. 9 with the exception that all numbers start with 9 rather than 8. These Figures clearly show that the magnitude of the asymmetry in the I-V characteristic is a function of the oxide thickness, barrier potential ($\phi_1$), and $\Delta\phi$.

The structural configuration in the present invention was designed and developed using the results of the above analysis. The major design goal of the present invention, therefore, was to develop and fabricate an MOMTD for mixer and detector applications in the submillimeter to optical wavelengths region. The development of such a structure requires the MOMTD to have the following characteristics:

(a) an oxide thickness in the 5 to 15 Å range for symmetrical structures and greater than 10 Å for asymmetrical junctions.

(b) a junction area ranging between $10^{-10}$ to $10^{-11}$ $cm^2$.

(c) negligible shunt capacitance (less than $10^{-17}$ farad).

(d) a diode that is structurally stable and almost invariant to local oscillator pump power (negligible dependence on temperature).

(e) negligible skin effect resistance contribution.

(f) junction fully exposed to input radiation (e.g., no SiO2 or similar dielectric covering the junction for the purpose of either passivation or for any other reason such as structural configuration).

(g) a structural configuration that is adaptable to the fabrication of diode arrays in a monolithic format. This includes the ability to be integrated with other components such as CCD, FETs and passive circuit elements.

The whisker-type MOMTD satisfies most of the above characteristic requirements except structural stability, repeatability, integratability and array potential.

Of the various MOM structures developed to date, the point contact (whisker-type) MOMTD is the only device that has been successfully used as a room temperature heterodyne mixer at infrared (10 $\mu$m) wavelengths. All other structures have only been successfully used as direct detectors at IR wavelengths. For these diode structures, the direct detected signal was predominantly attributable to thermal effects and not field assisted tunnel effects. Devices with outputs which are predominantly due to thermal effects are unsuitable as efficient coherent mixing devices.

Some of the reasons for the failure of prior art MOMTD devices to perform satisfactorily in the heterodyne mixing mode are: too large a junction area, excessively high series resistance at optical frequencies, a large thermal contribution resulting in a reduction of the tunneling probability, poor oxide quality, and finally, high parasitic shunt capacitance.

Figure 10A:
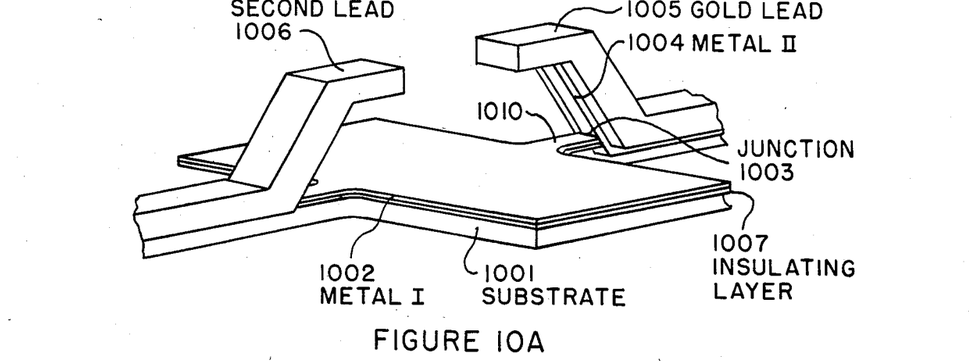
FIG. 10A is a perspective view of the present invention without metalization.
Figure 10B:
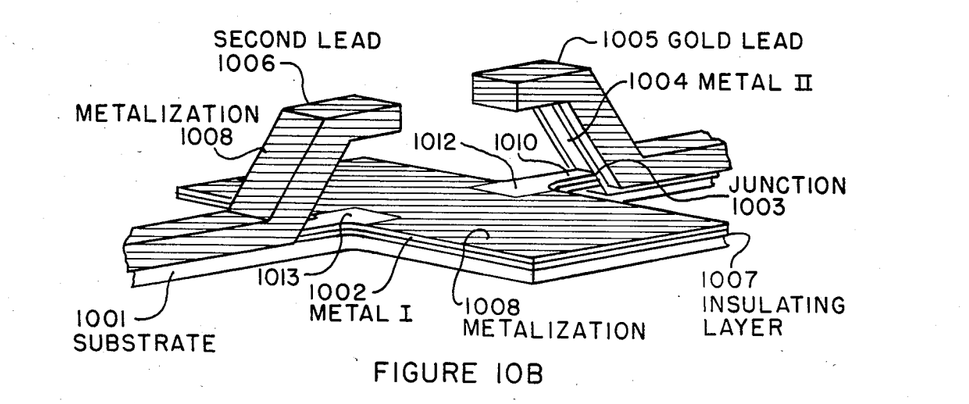
FIG. 10B is a perspective view of the present invention with metalization.
Figure 10C:
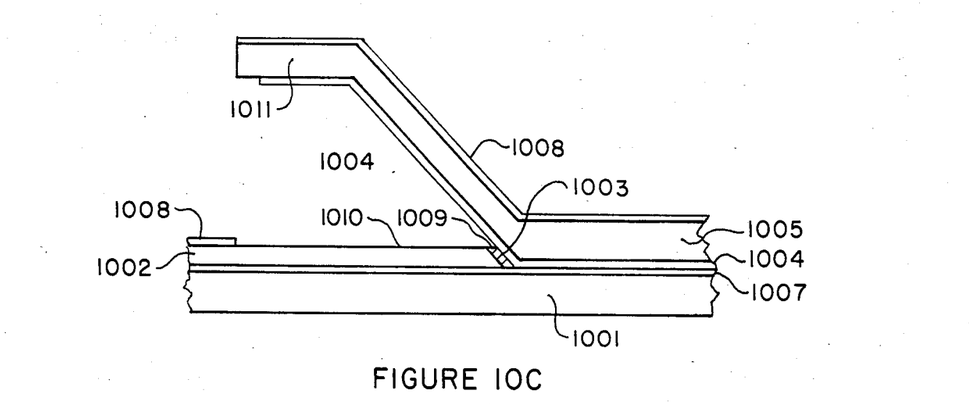
FIG. 10C is a cross sectional view of the region about the junction of the present invention.

To achieve the previously mentioned design objectives and overcome the above mentioned defects in prior art designs, the quasi-planar MOMTD configuration shown in FIGS. 10A, 10B and 10C was developed. FIG. 10A shows a two lead version of the invention without metalization, while FIG. 10B shows the same device with metalization. FIG. 10C shows a detailed cross section of the junction of the device shown in FIG. 10B. The devices comprise a substrate 1001, metal I layer 1002, a junction 1003, a metal II layer 1004, a first lead 1005, a second lead 1006, an insulating layer 1007, a metalization layer 1008, an oxide layer 1009, a peninsula-like portion of the metal I layer 1010 and a semiarch extension of the first lead 1011.

In this device, the upper surface of substrate 1001 is covered in succession by the insulating layer 1007 ranging in thickness from 1000 to 4000 Å layer 1002 and then the metalization layer 1008. The metal II layer 1004, which is located on a portion of the upper surface of the insulating layer 1007 that is not covered by the metal I layer, is fabricated in the form of a thin strip that is positioned beneath the lead 1005. A portion of the lead and the metal II layer extend above the surface of the insulating in the form of a semi-arch 1011. The second lead 1006 is constructed in a manner similar to lead 1005 and also includes a metal II layer beneath it.

At the point the lead and the metal II layer leave the surface of the insulating layer, the junction 1003 is formed in the area between a peninsula-like projection of the metal I layer 1010 and the metal II layer 1004. There is no direct contact between the metal I and metal II layers. Instead, as shown in FIG. 10C, an oxide 1009 (usually that of the metal I layer) located at the tip of the penisula-like projection 1010, makes contact with the metal II layer just as the metal II layer rises from the surface of the insulating layer. Note that the metal II layer under the lead has been etched to be approximately the same width as that of the tip of the peninsula-like projection. Also note that the junction has been formed at the periphery of a planar device rather than in the normal manner in which the total planar surface forms the junction. This approach greatly reduces the surface area of the junction. The junction area is further reduced by the narrow peninsula tip and narrow strip of metal II layer beneath the lead. The lead itself is relatively large as compared to the metal II strip to provide low loss. The peninsula-like projection tip ranges in length from 0.1 to 1.0 microns.

For a symmetrical junction, the same metal is used for metal I and metal II. Tantalum has been successfuly used for this purpose with an oxide layer being formed of native oxide ($Ta_2O_5$). Other metals could be used as well. In an asymmetrical structure, the metals are different. For example, metal I may be $Ta_2O_3$, and the metal II may be either MO, W or Au or another similar metals having a large ion radius. The large ion radius is needed, in the asymmetrical junction, in order to prevent diffusion of ions from metal II into the oxide. The occurrence of such a diffusion will greatly reduce the magnitude of the asymmetry.

As shown in FIGS. 10A, 10B and 10C, there is no dielectric near the junction. The absence of such a dielectric accomplishes the following objectives: (a) the production of negligible parasitic shunt capacitance between metal I and the semi-arch overhang of metal II, and (b) direct coupling of the junction to the incoming radiation without energy loss due to absorption through the dielectric material. These advantages gained from eliminating a dielectric coating are particularly important at IR wavelengths, especially above 5 microns, where most of the available dielectrics that can be processed, have a high loss tangent. Dielectric absorption also has the disadvantage of causing an increase in the junction temperature, which leads to an increase in the thermal assisted tunneling and an alteration of current-voltage characteristic of the diode.

Even though the present invention has removed the dielectric usually found in prior art devices, the performance of the MOMTDs using the structure shown in FIG. 10A is somewhat temperature dependent. This is because the thin metal I film ranging in thickness from 100 to 500 Å will be lossy at the IR wavelengths. To reduce the thermal contribution further, a thin film of gold, which is referred to as the metalization layer 1008 and is typically 500 to 1000 Å thick, is deposited over the complete structure, except about the junction as shown in FIG. 10B in areas 1012 and 1013 which are the projection of the semi-arch portion of the leads orthogonal to the surface of the device. In this configuration, the gold film will reflect over ninety percent of the incident IR radiation that is not coupled to the junction. In addition, it reduces the DC series resistance and the skin effect contribution at IR and submillimeter frequencies.

The series resistance contribution of the leads of metal II to the junction is also negligible in the subject structure. This is achieved by forming the leads from a thick overlayer of gold of from 5000 to 7000 Å thick which lies over the thin approximately 300 to 1500 Å thick metal II film.

There are a number of variations in both configuration and materials which remain within the scope of the invention. FIG. 10B shows a two lead device in which the leads face each other and lie in a single plane. This is actually a series connected, two junction device with one junction being located at the point each lead rises from the surface of the device. A single junction or a plurality of junctions in any parallel or series combination is possible with or without the leads being located in a single plane. This device has been especially designed for batch processing and eventual use in large arrays, where the arrays may take on any of a large number of possible configurations.

However, regardless of the array configuration, the semi-arch configuration of the individual diode must remain as it is in an important factor in enhancing the performance of the device because it functions as a monopole antenna for each junction, increasing the effective capture area and thus the efficiency beyond that which the junction alone could provide. It also serves as a mask for areas 1012 and 1013 during the metalization process.

Although a number of suitable materials for the different components of the device has been mentioned, it is appropriate to provide a more complete list here. The substrate may be selected from a group consisting of silicon, gallium arsenide and quartz, while the insulating layer may be selected from a group consisting of silicon nitride, and aluminum oxide. The metal I layer may be selected from the group consisting of tantalum, molybdenum, tungsten and niobium, while the second metal II layer may be selected from a group consisting of tantalum, molybdenum, tungsten, niobium, silver and gold. The oxide layer is preferably a native oxide of the metal I layer. The leads and the metal II layer are preferably of gold.

A number of successful devices have been fabricated in accordance with the present invention. A symmetrical device formed of tantalum-tantalum oxide-tantalum and two asymmetrical devices formed of tantalum-tantalum oxide-molybdenum and tantalum-tantalum oxide-gold were fabricated and proved to have excellent current-voltage characteristics in accordance with theoretical predictions. A number of asymmetrical devices were fabricated with varying oxide thicknesses. As predicted by the theory, the asymmetry became almost nonexistant as the oxide thickness approach the 10 Å range.

Experiments were performed on operating devices to determine the effects of a thick 4000 Å top film of silicon dioxide as well as the effects of the metalization layer. A diode fabricated on a quartz substrate with a metalization layer was tested for frequency response and found to have a roll-off in excess of that predicted by the theory, indicating that there was a thermally assisted contribution. Diodes metalized with a 500 Å thick layer of gold showed an improvement in the roll-off characteristic by an order to magnitude. However the roll-off still indicated the presence of a parasitic capacitance which also assisted in producing the excessive roll-off characteristic. Devices were then produced in which the entire silicon dioxide film was removed. These devices were also metalized. The result was an essentially flat frequency response indicating that both the thermally assisted contribution due to heating and the parasitic effect produced by the silicon dioxide film were eliminated. This final form of the invention is shown in FIG. 10B.

The diodes in the configuration shown in FIG. 10B were successfully tested as heterodyne mixers in the 10 microns range and achieved a noise equivalent power of $2 \times 10^{-14}$ watts/Hz. For this test the junction area of each diode was approximately 2 to $3 \times 10^{-10}$ cm$^2$ while the oxide thickness ranged from 5 to 10 Å. The diode junctions were separated by 4 microns.

Having described my invention, I claim:

1. A light sensitive detector comprising:
   (a) a planar substrate selected from a group consisting of semiconductors and dielectrics, having one planar surface considered as its upper surface,
   (b) a layer of electrically insulating material, referred to as an insulating layer on said upper surface of said substrate, said insulating layer ranging in thickness from 1000 to 4000 Å.
   (c) a first metal layer on the upper surface of said insulating layer, said first metal layer ranging in thickness from 100 to 500 Å.
   (d) a first peninsula-like projection of said first metal layer, referred to as a first projection, having a tip at the end of said first projection which is located on said insulating layer in an area in which there is no first metal layer on any side of said first projection, said first projection tip being generally orthogonal to said upper surface of said substrate and ranging in length from 0.1 to 1.0 microns,
   (e) a first metal oxide layer on said first projection tip,
   (f) a first lead extending along a portion of said upper surface of said substrate not covered by said metal layer, but which is covered by said insulating layer, a portion of said first lead extending above said upper surface of said substrate in a semi-arch configuration,
   (g) a second metal layer located between said first lead and said upper surface of said insulating layer, said second metal layer and said first lead being positioned to contact said first metal oxide layer on said first projection tip, the point of this contact determining the point at which said first lead extends upward and over the surface of said first projection as well as over said first metal layer in said semi-arch configuration, said second metal layer beneath said first lead being undercut on both sides of said first lead to be substantially the length of said first projection tip in the area of contact.

2. A light sensitive detector as claimed in claim 1, wherein said first and said second metal layers are formed of the same metal.

3. A light sensitive detector as claimed in claim 1, further comprising a third metal layer on the surface of said first metal layer, except in the area delineated by a projection of said semi-arch portion of said first lead on the orthogonal to said surface of said first metal layer.

4. A device as claimed in claim 3, further comprising a second lead, a second projection tip, and a second metal oxide layer, said second lead including a layer of said second metal beneath it, said first and said second leads generally lying in a plane orthogonal to said upper surface of said substrate and said first and said second leads being positioned with their ends directed towards one another, but not in contact with virtually complete an arch with their semi-arch segments, said third metal being on the surface of said first metal layer, except in the area delineated by a projection of said semi-arch portion of said second lead on and orthogonal to said surface of said first metal layer.

5. A device as claimed in claim 3, wherein said substrate is selected from the group consisting of silicon, gallium arsenide, and quartz, said insulating layer is selected from a group consisting of silicon nitride and aluminum oxide, said first metal layer is selected from a group consisting of tantalum, molybdenum, tungsten and niobium, each said first lead and said second lead is gold, said second metal layer is selected from a group consisting of tantalum, molybdem, tungsten, niobium, silver and gold, each said first metal oxide layer and said second metal oxide layer is a native oxide of said first metal and said third metal layer is gold.

* * * * *

UNITED STATES PATENT AND TRADEMARK OFFICE
CERTIFICATE OF CORRECTION

PATENT NO. : 4,549,194
DATED : Oct. 22, 1985
INVENTOR(S) : Joseph A. Calviello

It is certified that error appears in the above—identified patent and that said Letters Patent is hereby corrected as shown below:

Front page, left-hand column, delete the title "LIGHT SENSITIVE DETECTOR" and add the title --QUASI-PLANAR TUNNEL DIODE DETECTOR FOR OPERATION AT SUBMILLIMETER AND OPTICAL FREQUENCIES--.

Column 5, line 48, after "4000$\overset{\circ}{A}$" insert --, the metal I--.

Column 8, line 22, after "substrate not covered by said" insert --first--.

Column 8, line 46, before "orthogonal" delete "the" and add --and--.

Column 8, line 54, after "contact" delete "with" and add --to--.

Signed and Sealed this

Eleventh Day of February 1986

[SEAL]

Attest:

DONALD J. QUIGG

Attesting Officer  Commissioner of Patents and Trademarks